US010345639B1

(12) United States Patent
Nakagawa

(10) Patent No.: US 10,345,639 B1
(45) Date of Patent: Jul. 9, 2019

(54) CURVED DISPLAY

(71) Applicant: Panasonic Liquid Crystal Display Co., Ltd., Himeji-shi, Hyogo (JP)

(72) Inventor: Teruhisa Nakagawa, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 15/937,348

(22) Filed: Mar. 27, 2018

(51) Int. Cl.
| | |
|---|---|
| *G02F 1/1335* | (2006.01) |
| *G02F 1/1362* | (2006.01) |
| *G02F 1/1368* | (2006.01) |
| *G02F 1/1343* | (2006.01) |
| *H01L 27/12* | (2006.01) |
| *G09G 3/36* | (2006.01) |
| *G02F 1/1333* | (2006.01) |

(52) U.S. Cl.
CPC ...... *G02F 1/133512* (2013.01); *G02F 1/1368* (2013.01); *G02F 1/133516* (2013.01); *G02F 1/134336* (2013.01); *G02F 1/136286* (2013.01); *H01L 27/124* (2013.01); *H01L 27/1218* (2013.01); *H01L 27/1262* (2013.01); *G02F 2001/133354* (2013.01); *G02F 2201/123* (2013.01); *G09G 3/3648* (2013.01); *G09G 3/3696* (2013.01)

(58) Field of Classification Search
CPC ......... G02F 1/133512; G02F 1/136286; G02F 1/1368; G02F 1/134336; G02F 1/133516; G02F 2201/123; G02F 2001/133354; H01L 27/1218; H01L 27/1262; H01L 27/124; G09G 3/3648; G09G 3/3696
See application file for complete search history.

(56) References Cited

U.S. PATENT DOCUMENTS 10,168,458 B2 * 1/2019 Kong ............... G02F 1/136286
2017/0285392 A1 10/2017 Hirata et al.

* cited by examiner

*Primary Examiner* — David Vu
(74) *Attorney, Agent, or Firm* — Hamre, Schumann, Mueller & Larson, P.C.

(57) ABSTRACT

A curved display includes a first substrate and a second substrate in a stacked configuration. The first substrate includes pixel electrodes that are arranged in a matrix and electrical lines that extend in a first direction. The second substrate includes light shielding portions that extend in the first direction. Also disclosed is a method for manufacturing a curved display that includes attaching a first substrate to a second substrate in a stacked configuration and bending the first substrate and the second substrate to be curved.

6 Claims, 6 Drawing Sheets

CURVED DISPLAY

FIELD

This disclosure relates to the configuration of pixels in a curved electronic display device having at least two substrates.

BACKGROUND

An electronic display device provides a plurality of tiny individual pixels that form the displayed image. The electronic display device may include one or more display panels that form the pixels in the displayed image. A panel may include pixels that each filter light to form the pixels of the displayed image. The display panel may include at least two substrates. Previously, electronic display devices were formed to be flat. However, newer electronic display devices are being designed to have a curved display surface.

BRIEF SUMMARY

A curved display can include a first substrate and a second substrate that are curved along the first direction. The second substrate is disposed along a surface of first substrate in a stacked configuration. The first substrate includes pixel electrodes and electrical lines that extend a first direction. The second substrate includes light shielding portions that extend in the first. The bending of the first and second substrates from a flat shape into a curved shape causes corresponding components in the first and second substrates to become shifted relative to each other. The positions of the pixel electrodes relative to their corresponding electrical lines or the positions of the light shielding portions are varied to account for this shift.

In an embodiment, a curved display includes a first substrate that is disposed along a second substrate in a stacked configuration. The first substrate and the second substrate are curved along a first direction. The first substrate includes pixel electrodes arranged in a matrix in the first direction and a second direction and electrical lines that extend in the second direction. The second substrate includes light shielding portions that extend in the second direction. The pixel electrodes include a first end pixel electrode, a central pixel electrode, and a middle pixel electrode. The first end pixel electrode is located at an end of the curved display in the first direction. The central pixel electrode is located closer to a center of the curved display than the first end pixel electrode. The middle pixel electrode is disposed between the central pixel electrode and the first end pixel electrode.

A first clearance is a clearance in the first direction between the middle pixel electrode and an electrical line that is electrically connected to the middle pixel electrode. A second clearance is a clearance in the first direction between the central pixel electrode and a respective one of the electrical lines electrically connected to the central pixel electrode. A third clearance is a clearance in the first direction between the first end pixel electrode and a respective one of the electrical lines electrically connected to the first end pixel electrode. The first clearance is different from the second clearance and the third clearance.

In an embodiment, a method for manufacturing a curved display includes attaching a first substrate to a second substrate in a stacked configuration and bending the first substrate and the second substrate to be curved along a first direction. The first substrate includes electrical lines and pixel electrodes. The pixel electrodes are arranged in a matrix in the first direction and a second direction. The electrical lines extend in the second direction.

The second substrate includes light shielding portions that extend in the second direction. The second substrate includes a first end light shielding portion, a central light shielding portion, a middle light shielding portion, a first group of light shielding portions, a second group of light shielding portions. The first end light shielding portion is disposed at an end of the curved display in the first direction. The central light shielding portion is disposed closer to a center of the curved display in the first direction than the first end light shielding portion. The middle light shielding portion disposed between the central light shielding portion and the first end light shielding portion in the first direction. The first group of light shielding portions is located between the central light shielding portion and the middle light shielding portion. Second group of light shielding portions are located between the central light shielding portion and the first end light shielding portion. Before the first substrate and the second substrate are bent, the shielding portions of the first group have a pitch that is different from an average pitch of light shielding portions of the second group.

In an embodiment, a method for manufacturing a curved display includes attaching a first substrate to a second substrate in a stacked configuration and bending the first substrate and the second substrate to be curved along the first direction. The first substrate includes pixel electrodes the pixel electrodes that are arranged in a matrix in a first direction and a second direction and electrical lines that extend in the second direction. The second substrate includes light shielding portions that extend in the second direction.

The first substrate includes a first end pixel electrode, a central pixel electrode, and a middle pixel electrode. The first end pixel electrode is located at an end of the curved display in the first direction. The central pixel electrode is located closer to a center of the curved display than the first end pixel electrode. The middle pixel electrode is located between the central pixel electrode and the first end pixel electrode in the first direction. A first clearance is a clearance in the first direction between the middle pixel electrode and a respective one of the electrical lines electrically connected to the middle pixel electrode. A second clearance is clearance in the first direction between the central pixel electrode and a respective one of the electrical lines electrically connected to the central pixel electrode. A third clearance is a clearance in the first direction between the first end pixel electrode and a respective one of the electrical line electrically connected to the first end pixel electrode. The first clearance is different from the second clearance and the third clearance.

BRIEF DESCRIPTION OF THE DRAWINGS

Both described and other features, aspects, and advantages of a curved display panel will be better understood with reference to the following drawings.

Like reference numbers represent like parts throughout.

DETAILED DESCRIPTION

Figure 1:
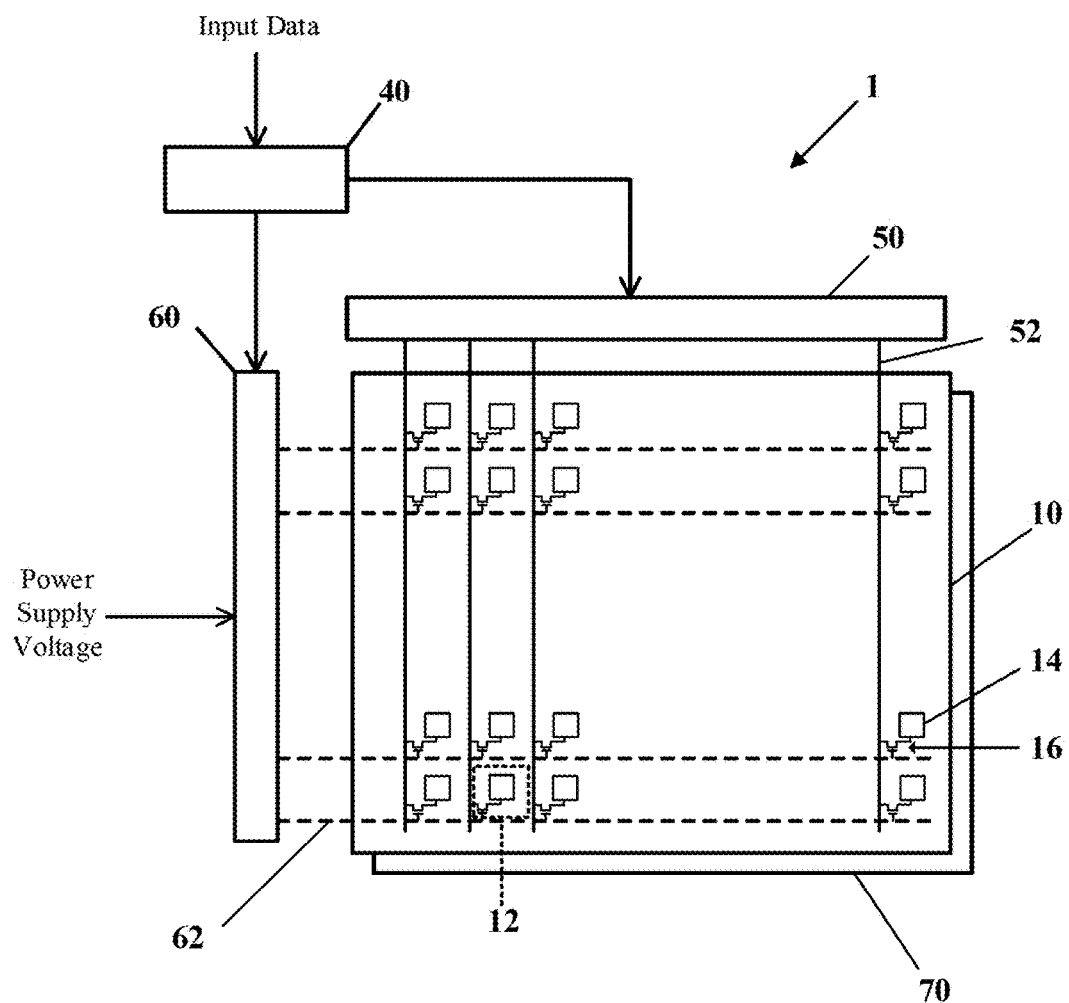
FIG. 1 shows a schematic view of a curved display in an embodiment.
Figure 1:
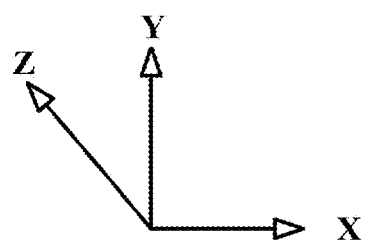

An electronic display device may be in the form of a liquid crystal electronic display ("LCD") device. A display panel of the electronic display device may include a multiple substrates. For example, the display panel may include a first substrate with color filters and light shielding portions and a second substrate with a thin film transistor ("TFT") layer and pixel electrodes. A liquid crystal layer that is controlled by the pixel electrodes may be sandwiched between the first and second substrates. Each pixel electrode controls a portion of the liquid crystal layer that overlaps with a color filter in the color filter ("CF") layer. A specific voltage is applied to each pixel electrode to form an electric field across each pixel's portion of the liquid crystal layer. An electric field affects how the liquid crystal layer changes the orientation of the light passing through the liquid crystal layer. A polarizer layer or sheet may be provided that only allows a single orientation of light to pass through. Each pixel may control how its portion of the liquid crystal reorients light to filter light.

As light travels through the liquid crystal display layer from the second substrate to the first substrate in a direction normal to the liquid crystal layer, some of the light may also travel in a direction perpendicular to the normal direction. Additionally, the pixel electrodes may not form strong electric fields in the areas of the liquid crystal layer that are between adjacent pixel electrodes. This can result in these areas not properly filtering light as they are not provided with an adequate electric field. The light shielding portions in the first substrate are positioned between the color filters and/or along areas that correspond to the areas between pixel electrodes. The light shielding portions may block the light that travels in the perpendicular direction in the liquid crystal layer and/or the light that passes through the areas of the liquid crystal layer between the pixel electrodes that is not properly filtered.

A curved display panel for a curved electronic display device may be manufactured by attaching the second substrate to the first substrate in a stacked configuration and then bending the first and second substrates to form the curved substrates of the curved display panel for the curved display panel. The substrates are bent while keeping their edges that extend in a direction perpendicular to the bending direction in a fixed position. The bending results in the front and back substrates having different curvatures and strains as the front substrate and back substrate do not have the same position. For example, if the first substrate is closer to the viewer (e.g., the person viewing the curved electronic display device) than the second substrate and first and second substrates are bent to have a convex shape towards the viewer, the first substrate would have a smaller curvature than the second substrate. The curved display panel (and its first substrate and second substrate) would also have a convex shape towards the display side of the curved electronic display device. The display side of the curved electronic display device is the side (or surface) that faces towards the viewer and is observed by the viewer when watching the curved electronic display device. The difference in the curvature of the first and second substrates results in corresponding portions of the first substrate and the second substrate being shifted relative to each other along the direction of the curvature. This shift can result in some of the light shielding portions in the first substrate being offset along the direction of the curvature relative to their corresponding electrical lines. For example, the curvature can result in light shielding portions not being positioned to block the light that travels in the perpendicular direction in the liquid crystal layer and/or to block the light from the areas between the pixel electrodes that has not been properly filtered.

In some embodiments disclosed herein, the light shielding portions are positioned relative to each other to account for the shift that occurs between substrates when the substrates are bent. In some embodiments disclosed herein, the pixel electrodes are positioned relative to their corresponding electrical lines to account for the shift between substrates when the substrates are bent.

Figure 4:
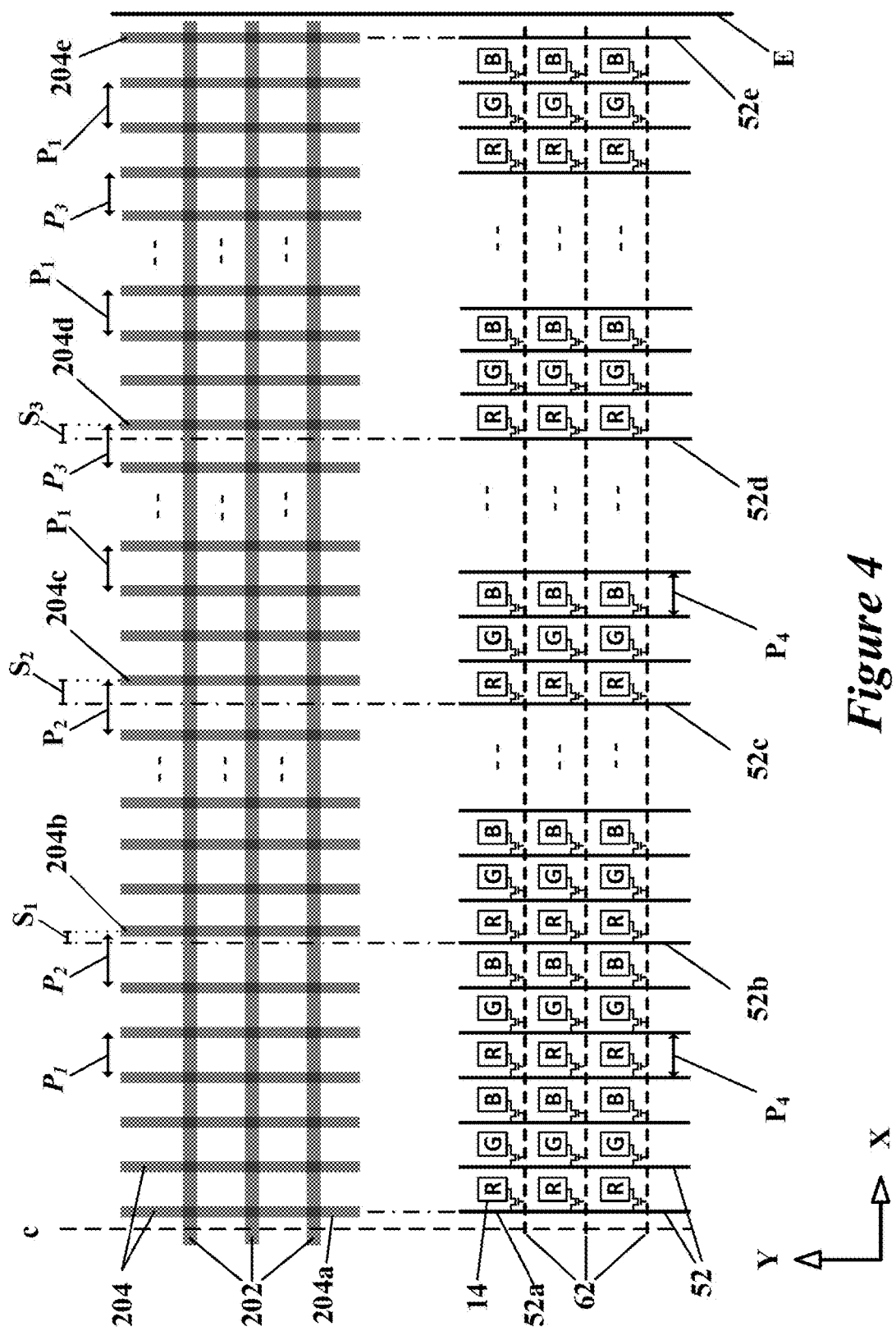
FIG. 4 is a schematic view of light shielding portions for a CF substrate and a corresponding portion of a TFT substrate in an embodiment.

FIG. 1 shows a schematic view of a curved display 1 in an embodiment. The curved display 1 may include a display panel 10, a display control circuit 40, a data line driver circuit 50, and a gate line driver circuit 60, and a light source 70. The viewing direction of the curved display 1 is along the Z direction in FIG. 1. The light source 70 provides unfiltered light to the display panel 10. For example, the light source 70 may be backlight. The display panel 10 has pixels 12 that are arranged in a matrix. The pixels 12 in an embodiment are arranged in a matrix having rows along a first direction (e.g., the X direction) and columns along a second direction (e.g., the Y direction). The curved display 1 displays an image by controlling each pixel to filter light in a specific manner. For example, the pixels 12 may be configured to filter a specific color of light or filter light without filtering a specific color of light (e.g., for brightness). The pixels 12 in an embodiment may be configured to filter red, green, or blue light. For example, as shown in FIG. 4 (which is described below), the red, blue, and green pixels 14 may repeat in a row such that each set of adjacent three pixels includes one (red) pixel 12 that filters red light, one (green) pixel 12 that filters green, and one (blue) pixel 12 that filters blue light. For example, a red pixel 12 may provide the red light for a pixel in the displayed image. In such an embodiment, the light of each pixel in the image displayed by the curved display 1 is formed by the combined red light, green light, and blue light provided by a respective red pixel 12, green pixel 12, and blue pixel 12. In an embodiment, the pixels 12 may filter two or more colors. In an embodiment, one or more of the pixels 12 may provide brightness. In an embodiment, the curved display 1 may include multiple display panels.

The display panel 10 includes electrical lines for controlling the pixel electrodes 14. The electrical lines include data lines 52 that are electrically connected to the data line driver circuit 50 and gate lines 62 that are electrically connected to the gate line driver circuit 60. In an embodiment, an area defined by an adjacent pair of data lines 52 and an adjacent pair of gate lines 62 may define the area of a pixel 12. Each pixel electrode 14 is electrically connected to one of the gate lines 62 and to one of the data lines 52 by a thin film transistor ("TFT") 16.

During operation, the display control circuit 40 receives input data (e.g., a video input) corresponding to an image that is to be displayed by the curved display 1. The display control circuit 40 provides control signals to the data line driver circuit 50 and the gate line driver circuit 60 based on the input data. The data line driver circuit 50 provides a data signal (e.g., a data voltage) to each data line 52 based on the control signal and the input data. The gate line driver circuit 60 provides a gate signal (e.g., a gate voltage) to each gate line 62 based on the control signal and a power supply voltage provided to the gate line driver circuit 60.

The curved display 1 may be curved along the X direction or along the Y direction. The curved display 1 in an embodiment may be curved along the X direction or along the Y direction so that its shape is concave towards the viewer. The curved display 1 in an embodiment may be curved so that its shape is convex towards the viewer.

Figure 2:
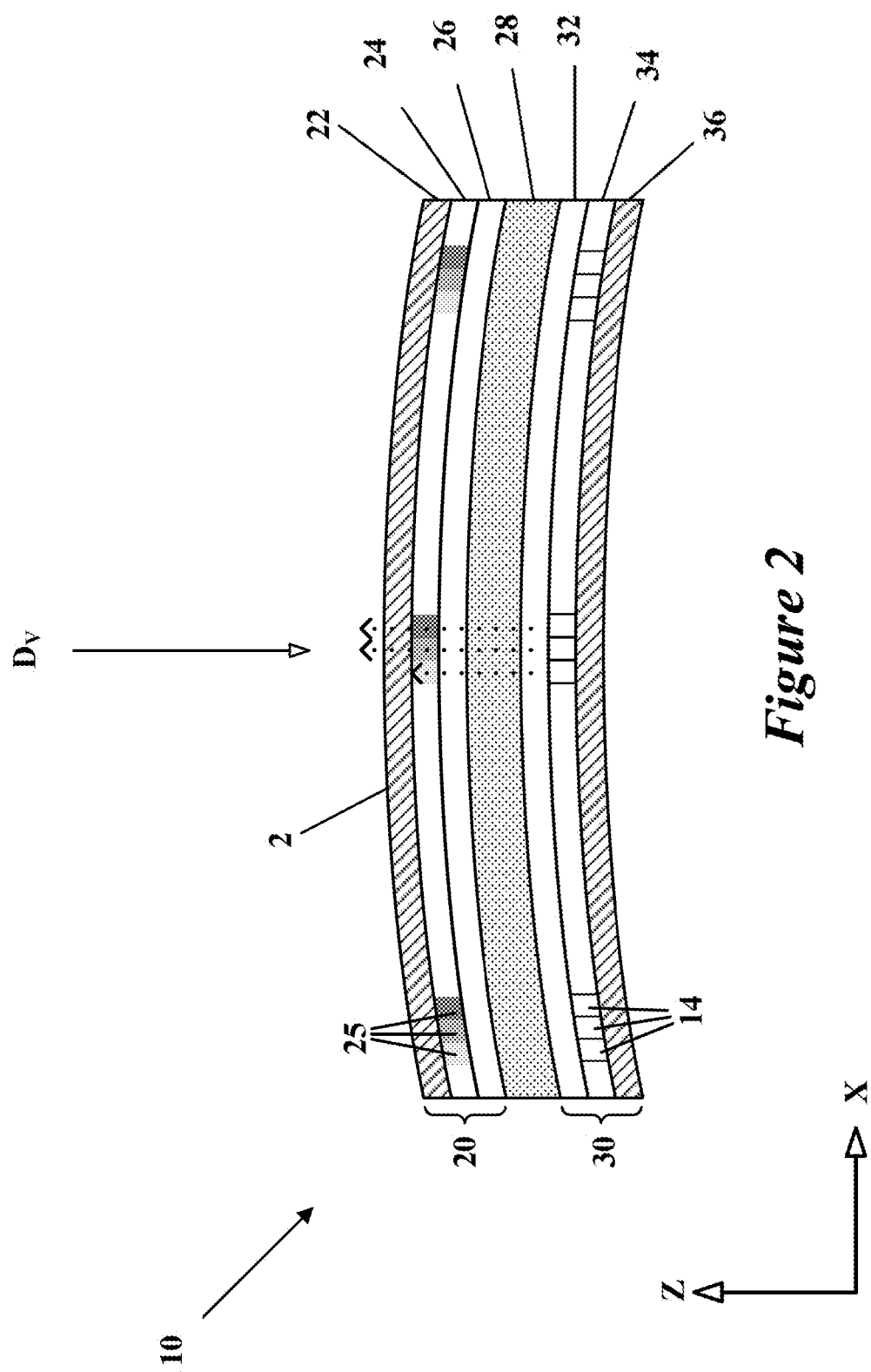
FIG. 2 illustrates the layered components of a display panel of a curved display in an embodiment.

The display panel 10 is composed of a series of layered components. FIG. 2 shows a schematic view of a cross section of the layered components of the display panel 10 in an embodiment. A person views the display side 2 of the display panel 10 in the viewing direction $D_V$. In an embodiment, if the display panel 10 is the closest display panel to the person viewing the curved display device 1 then the display side 2 of the display panel 10 would also be the display side of the curved display device 1. The display panel 10 may include a liquid crystal layer 28 that is sandwiched between a first substrate 20 and a second substrate 30. The second substrate 30 may be a thin film transistor ("TFT") substrate that includes a glass substrate 34 sandwiched between an alignment film 32 and a rear polarizing layer 36. The glass substrate 34 of the TFT substrate 30 includes the pixel electrodes 14, the data lines 52 (shown in FIG. 1), and the gate lines 62 (shown in FIG. 1). The first substrate 20 may be a color filter ("CF") substrate that includes a glass substrate 24 sandwiched between a front polarizing layer 22 and an alignment film 26. The glass substrate 24 includes color filters 25 and light blocking portions (described below).

Each of the color filters 25 is configured to correspond to one of the pixel electrodes 14. A color filter 25 in an embodiment may be configured to filter a specific color (e.g., green, red, blue, yellow, white) or may be transparent. Each of the polarizing layers 22, 36 only allows a single orientation of light to pass through. The liquid crystal layer 28 may change the orientation of the light as it passing through the liquid crystal layer 28. Following known principles of liquid crystal displays, each pixel electrode 14 applies an electric field to a portion of the liquid crystal layer 28 adjacent to the pixel electrode 14 to control how much of the light is reoriented as said light travels through said portion of the liquid crystal layer 28. Each pixel electrode 14 controls a portion of the liquid crystal layer 28 along a respective color filter 25 so as to allow a specific amount (including all of or none) of the light that passes through the respective color filter 25 to have the same orientation as the front polarizer layer 22. The light having the same orientation as the front polarizer layer 22 is not blocked by the front polarizer layer 22. Accordingly, the respective pixel electrodes 14 control how much of the light that passes through each of the color filters 25 is allowed to also pass through the front polarizer layer 22 to be observed by the viewer.

Figure 3:
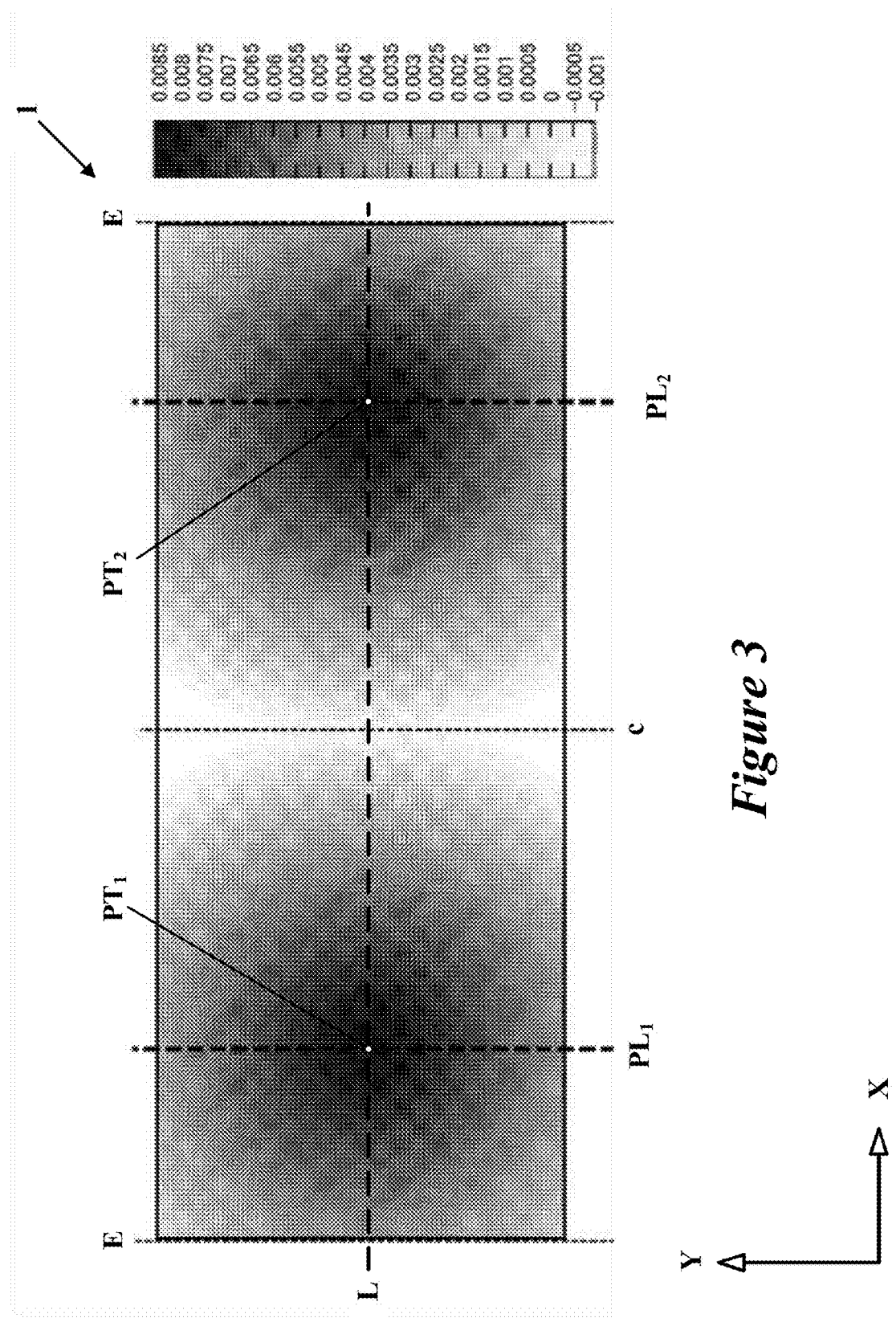
FIG. 3 is a diagram showing an effect of T/C shift between a color filter ("CF") substrate and a thin film transistor ("TFT") substrate of a cured display in an embodiment.

To produce the curved display panel 10 of the curved display 1, each of the substrates 20, 30 is first formed in a flat shape and attached front to back in a stacked configuration with the liquid crystal layer 28 sandwiched between the substrates 20, 30. The flat substrates 20, 30 and liquid crystal layer 28 are then bent to have the desired shape (e.g., convex or concave). In an embodiment, the flat substrates 20, 30 and the liquid crystal layer 28 are bent along the X direction to be convex towards the viewer as shown in FIG. 2. In an embodiment, the flat substrates 20, 30 and the liquid crystal layer 28 may be bent along the X direction to be concave towards the viewer. In an embodiment, the flat substrates 20, 30 and liquid crystal layer 28 may be bent along the Y direction to be concave or convex towards the viewer. When the substrates 20, 30 are bent, the edges that extend in a direction perpendicular to the bending direction are kept fixed in place. For example, when the substrates 20, 30 are bent in the X direction, both edges of each substrate 20, 30 that extend in the Y direction are fixed in place. The bending of the substrates 20, 30 results in the substrates 20, 30 having different strains and different curvatures. Accordingly, some of the components of the CF substrate 20 are shifted relative to their corresponding components in the TFT substrate 30 in the bend direction (e.g., the X direction in FIG. 2). This shift between the two substrates 20, 30 may be referred to as T/C shift. For example, as shown in FIG. 2, the color filters 25 are shifted relative to their corresponding pixel electrodes 14 in the bend direction FIG. 3 is a diagram showing the effect of the T/C shift between the CF substrate 20 and the TFT substrate 30 of curved display 1. The darker areas are portions of the substrates 20, 30 that have greater amount of T/C shift. A legend is provided on the right side of FIG. 3. The values in the legend represent millimeters of T/C shift. For example, the largest value in the legend is 0.0085 mm or 8.5 µm. The T/C shift between the CF substrate 20 and the TFT substrate 30 reaches a maximum value at along planes $PL_1$ and $PL_2$. Planes $PL_1$ and $PL_2$ extend along the X direction and the thickness direction of the display panel 10. In an embodiment, there is no relative shift between the substrates 20, 30 along the center plane c of the curved display 1 or the opposing edges E that extend in the transverse direction to the bend direction (e.g., the Y direction). Going from the center plane c toward either edge E of the curved display 1 along the bend direction (e.g., along the X direction), the shift increases until reaching plane $PL_1$ or $PL_2$, then decreases until reaching an edge E of the curved display 1. For illustration, FIG. 3 includes a line L that extends along the bend direction (e.g., along the X direction) of the curved display 1, and points $PT_1$ and $PT_2$ that are at the intersection of line L and the planes $PL_1$ and $PL_2$, respectively. Going from the center plane C along line L towards either edge of the curved display 1, the shift increases until reaching point $PT_1$ or point $PT_2$, then decreases until reaching one of the edges E of the curved display 1. For example, the maximum shift between the CF substrate 20 and the TFT substrate 30 at points $PT_1$ and $PT_2$ may be 8.4 µm in an embodiment. The curved display 1 in an embodiment may be bent in the Y direction instead of the X direction. In such an embodiment, the shift between the substrates would occur along the Y direction instead of the X direction.

FIG. 4 is a schematic view of light shielding portions 202, 204 and pixel electrodes 14 in an embodiment. FIG. 4 shows the light shielding portions 202, 204 as formed in the CF substrate 20 before the CF substrate 20 is bent. The light shielding portions 202 extend in the X direction and the light shielding portions 204 extend in the Y direction. When the substrates 20, 30 are stacked together, the light shielding portions 202 extending in the X direction are configured to overlap with the gate lines 62 and the light shielding portions 204 extending in the Y direction are configured to overlap with the data lines 52.

As discussed above, a portion of the light traveling through the liquid crystal layer 28 may travel in a direction perpendicular to the liquid crystal layer 28, and light passing through areas between pixel electrodes 14 may not be properly filtered due to an inadequate electric field. The light shielding portions 202, 204 are configured to block this perpendicular light and improperly filtered light. However, when the substrates 20, 30 are bent in the X direction, the light shielding portions 204 are shifted in the X direction relative to their corresponding data lines 52 due to the T/C shift. The light shielding portions 204 in FIG. 4 have a configuration that accounts for the T/C shift.

The left side of FIG. 4 corresponds to the center of the curved display 1 in the X direction as indicated by the dashed line c. For example, light shielding portion 204a is located closer to the center of the curved display 1 in the X direction than light shielding portion 204b. Light shielding portion 204a may be defined as the central light shielding portion. The right side of FIG. 4 is near the edge E of the curved display 1. Light shielding portion 204e is disposed at the edge E of the curved display 1 in the X direction. Light shielding portion 204e may be defined as the end light shielding portion. In an embodiment, the end light shielding portion 204e is disposed at the edge of the curved display 1 as a distance between the end light shielding portion 204e and the edge E is equal to about 10% or less of length of the curved display 1 in the X direction. Light shielding portion 204c is located between the central light shielding portion 204a and the end light shielding portion 204e. Light shielding portion 204c may be defined as the middle light shielding portion as the light shielding portion 204c is between the central light shielding portion 204a and the end light shielding portion 204e. The light shielding portion 204b is located between the central light shielding portion 204a and the middle light shielding portion 204c. A light shielding portion 204d is located between the middle light shielding portion 204c and the edge light shielding portion 204e. For illustration purposes, FIG. 4 does not include all of the pixel electrodes 14, the light shielding portions 204, and data lines 52 that the curved display 1 would have in a portion from the center c to an edge E. Accordingly, the symbol "- -" is shown in FIG. 4 (and FIGS. 5 and 6) to indicate omitted components (e.g., pixel electrodes 14, data lines 52, light shielding portions 204 that extend in the X direction).

To account for the T/C shift that occurs between the substrates 20, 30 when the substrates 20, 30 are bent along the X direction, the light shielding portions 204 that extend in the Y direction are shifted relative to their respective data lines 52 as shown in FIG. 4. Shift (e.g., shift $S_1$, shift $S_2$, shift $S_3$) is the distance in the X direction between a light shielding portion 204 and its corresponding data line 52 when the substrates 20, 30 are attached in a stacked configuration. The amount of shift increases as the light shielding portions 204 get closer in the X direction to the plane (e.g., plane PL1 or PL2 in FIG. 3) where the shift between the substrates 20, 30 is greatest. When the substrates 20, 30 are bent, the middle light shielding portion 204c in an embodiment is the light shielding portion 204 closest in the X direction to the point of maximum shift (e.g., $PT_1$ or $PT_2$ in FIG. 3). Accordingly, the light shielding portion 204c is positioned so that the shift $S_2$ between the middle light shielding portion 204c and its corresponding data line 52c is the greatest amount of shift or is equal to the greatest amount of shift. Further, the shift $S_1$ between the light shielding portion 204b and its corresponding data line 52b is smaller than the shift $S_2$ of the middle light shielding portion 204c and is larger than a shift between the central light shielding portion 204a and its corresponding data line 52a in an embodiment. The shift $S_3$ between the light shielding portion 204d and its corresponding data line 52d is smaller than the shift $S_2$ of the middle light shielding portion 204c and is larger than a shift between the end light shielding portion 204e and its corresponding data line 52e. In an embodiment, one or both of the shift of the central light shielding portion 204a and the shift of the end light shielding portion 204e may be zero or about zero (e.g., at or about no shift) as shown in FIG. 4.

FIG. 4 illustrates light shielding portions 202, 204 for the curved display 1 that is curved along the X direction to be convex towards the viewer. In an embodiment, the curved display 1 may be curved to be concave towards the viewer. In such an embodiment, the pitch relationships would be the inverse of what is shown in and described above for FIG. 4. For example, the $P_3$ would be larger than $P_1$ and $P_2$. In an embodiment, the curved display 1 may be curved in the Y direction instead of the X direction. In such an embodiment, the light shielding portions 202 extending in the X direction may be configured (e.g., positioned relative to each other) to account for a T/C shift in the Y direction in a similar manner as described for the light shielding portions 204.

In an embodiment, the light shielding portions 204 have at least three pitches in the X direction. Pitch is a length in the X direction from the middle of a first light shielding portion 204 to the middle of an adjacent light shielding portion 204. A majority of the adjacent light shielding portions 204 have first pitch $P_1$. The first pitch $P_1$ in an embodiment is a pitch that is not modified to account for the substrates 20, 30 being bent. In an embodiment, the first pitch $P_1$ is equal to a pitch $P_4$ between adjacent data lines 52. The pitch $P_4$ may be the average pitch between adjacent data lines 52 in an embodiment. In an embodiment, the data lines 52 may be configured so that every adjacent pair of data lines 52 has an equal pitch $P_4$. A second pitch $P_2$ has a greater length than the first pitch $P_1$. A third pitch $P_3$ has a shorter length than the first pitch $P_1$ and the second pitch $P_2$.

The pairs of adjacent light shielding portions 204 with the second pitch $P_2$ are located between the central light shielding portion 204a and the middle light shielding portion 204c. In an embodiment, the maximum amount of T/C shift between the substrates 20, 30 after being bent may be 8.4 µm. In such an embodiment, the maximum amount of shift between corresponding components of the substrates 20, 30 is 8.4 µm. The light shielding portions 204 may be configured so that the shift $S_2$ is at or about 8.0 µm to account for the shift between the substrates 20, 30. The second pitch $P_2$ in an embodiment may be 1.0 µm greater than the first pitch $P_1$. In such an embodiment, eight adjacent pairs of the light shielding portions 204 have pitch $P_2$. The adjacent pairs of light shielding portions 204 with pitch $P_2$ may be spaced at or about equal distances apart in the X direction.

Adjacent light shielding portions 204 having the pitch $P_3$ are provided between the middle light shielding portion 204c and the end light shielding portion 204e. In an embodiment, the difference in the length between the second pitch $P_2$ and the first pitch $P_1$ may be equal to the different in length between the first pitch $P_1$ and the third pitch $P_3$ (e.g., $P_2-P_1=P_1-P_3$). As the second pitch $P_2$ is 1.0 µm greater than the first pitch $P_1$, the third pitch $P_3$ may be 1.0 µm shorter than the first pitch $P_1$. As there is no shift between the end light shielding portion 204e and its corresponding data line 52e and the shift $S_2$ of the middle light shielding portion 204c is 8.0 in an embodiment, there would be eight pairs of adjacent light shielding portions 204 with the third pitch $P_3$ between the middle light shielding portion 204c and the end light shielding portion 204e.

In an embodiment, light shielding portions 204 that are adjacent to each other and located between the central light shielding portion 204a and the middle light shielding portion 204c in the X direction belong to a first group, and light shielding portions 204 that are adjacent to each other and located between the middle light shielding portion 204c and the end light shielding portion 204e in the X direction belongs to a second group. The first group includes the adjacent light shielding portions 204 having the pitch $P_2$ and adjacent light shielding portions 204 having the pitch $P_1$, and second group includes the adjacent light shielding portions 204 having the pitch $P_3$ and adjacent light shielding portions 204 having the pitch $P_1$. In such an embodiment, the average pitch between light shielding portions 204 of the first group is different from the average pitch between light shielding portions 204 of the second group.

Figure 5:
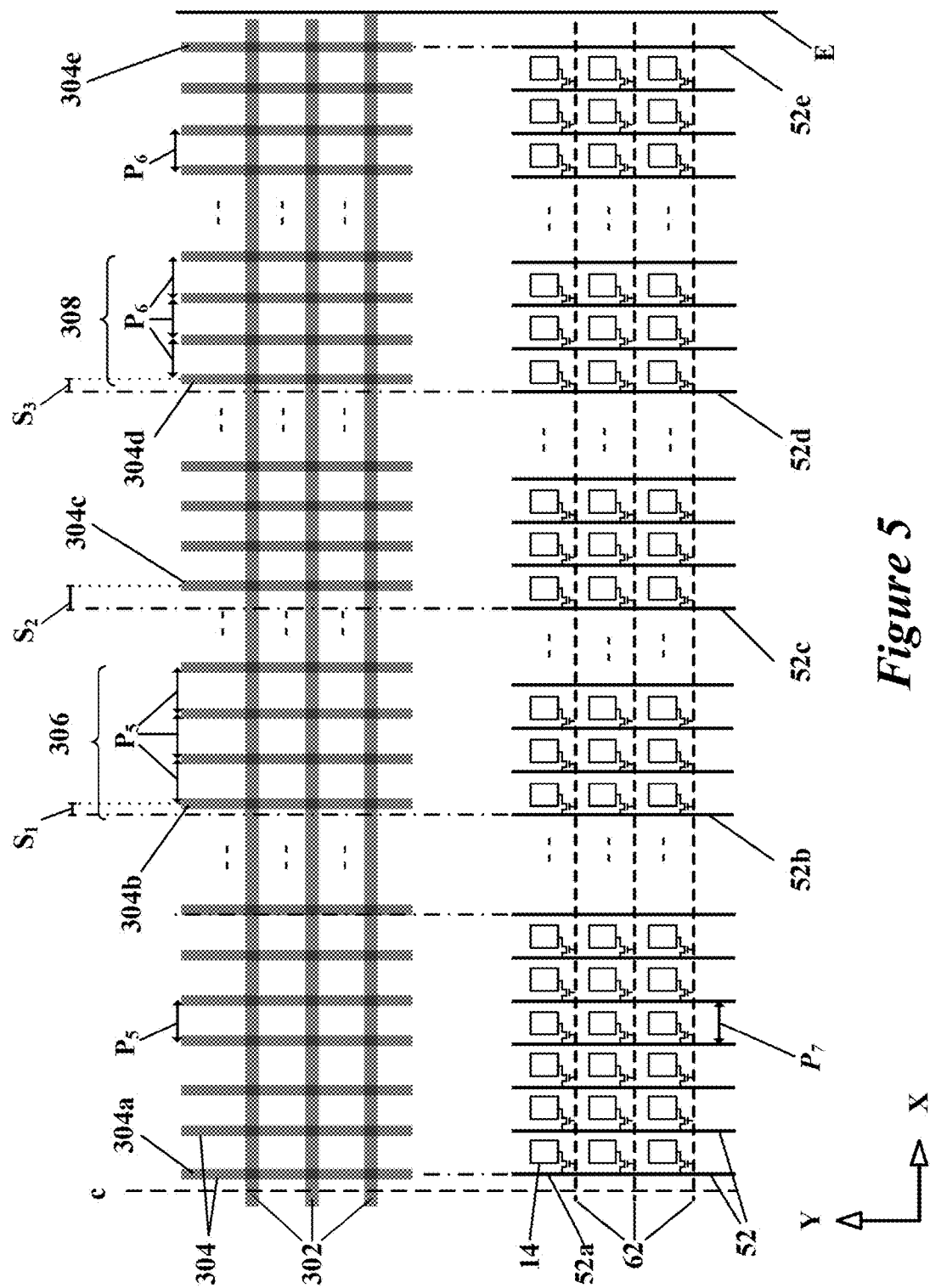
FIG. 5 is a schematic view of light shielding portions for a CF substrate and a corresponding portion of a TFT substrate in an embodiment.

FIG. 5 is a schematic diagram of light shielding portions 302, 304 formed in a portion of the CF substrate 20 and a corresponding portion of the TFT substrate 30 in an embodiment. FIG. 5 shows the light shielding portions 302, 304 before the CF substrate 20 and TFT substrate 30 are bent into a curved shape. The light shielding portions 302 extend in the X direction and the light portions 304 extend in the Y direction. The light shielding portions 304 include a central light shielding portion 304a, a middle light shielding portion 304c, and an end light shielding portion 304e. The end light shielding portion 304e is disposed at the edge E of the curved display 1. In an embodiment, the end light shielding portion 304e is disposed at the edge E of the curved display and a distance between the end light shielding portion 304e and the edge E is equal to or about 10% or less than the length of the curved display 1 in the X direction. The central light shielding portion 304a is a light shielding portion that is located closer to a center (e.g. close to the center plane c) of the curved display 1 in the X direction than the end light shielding portion 304e. The central light shielding portion 304a in an embodiment may extend along the center plane c of the curved display 1. The middle light shielding portion 304c is located between the central light shielding portion 304a and the end light shielding portion 304e in the X direction.

The light shielding portions 304 may include a first group of light shielding portions 306 that are adjacent to each other and are located between the central light shielding portion 304a and the middle light shielding portion 304c in the X direction. The average pitch between adjacent light shielding portions 304 of the first group of light shielding portions 306 is equal to a first pitch $P_5$. In an embodiment, the average pitch of a group may be calculated by determining a pitch of each adjacent pair of the light shielding portions 304 in the group then averaging all of the pitches. As shown in FIG. 5, the first group of light shielding portions 304 includes four light shielding portions 304. For example, the average pitch of the first group of light shielding portions 306 may be calculated by average the three pitches $P_5$. However, in other embodiments, the first group of light shielding portions 306 may include, for example, one-hundred adjacent light shielding portions 304.

The light shielding portions 304 may include a second group of light shielding portions 308 that adjacent to each other and are located between the middle light shielding portion 304c and the end light shielding portion 304e in the X direction. The average pitch between adjacent light shielding members 304 of the second group of light shielding portions 308 is equal to the second pitch $P_6$. As shown in FIG. 5, the second group of light shielding portions 306 includes four light shielding portions 304. For example, the average pitch of the first group of light shielding portions 306 may be calculated by average the three pitches $P_6$. However, the second group of light shielding 306 in an embodiment may include, for example, one-hundred adjacent light shielding portions 304.

The middle light shielding portion 304c in an embodiment is the light shielding portion 304 closest to the point of maximum shift (e.g., point $PT_2$ shown in FIG. 3). The average pitch between the data lines 52 may be a third pitch $P_7$. In an embodiment, the data lines 52 may be configured so that any two pair of adjacent data lines 52 has an equal pitch (e.g., third pitch $P_7$). The first pitch $P_5$ is larger than the second pitch $P_6$ and the third pitch $P_7$. The second pitch $P_6$ is smaller than the first pitch $P_5$. Except for the central light shielding portion 304a and the end light shielding portion 304c, the light shielding portions 304 are offset from their respective data lines 52 in the X direction as the light shielding portions 304 have pitches $P_5$, $P_6$ that are not equal to the pitch $P_7$ of the data lines 52.

Moving in the X direction from the central light shielding portion 304a to the end light shielding portion 304e, the shifts (e.g., shift $S_1$, shift $S_2$, Shift $S_3$) of the light shielding portions 304 relative to their respective data lines 52 continuously increase until reaching the middle light shield portion 304c and then continuously decrease until reaching the end light shielding portion 304e. Moving in periodic intervals in the X direction from the central light shielding portion 304a to the end light shielding portion 304e, the shifts (e.g., shift $S_1$, shift $S_2$, Shift $S_3$) of the light shielding portions 304 relative to their respective data lines 52 increases at each interval until reaching the middle light shield portion 304c and then decreases at each interval until reaching the end light shielding portion 304e. Thus, the light shielding portions 304 of FIG. 5 may provide similar shifts to the light shielding portions 204 of FIG. 4, except that the light shielding portions 304 provide the shift in a more a continuous manner.

The middle light shielding portion 304c relative to its corresponding data line 52c has a shift $S_2$. The shift $S_2$ of the middle light shielding portion 304c in an embodiment may be equal to or about the maximum T/C shift when the substrates are bent. For example, the shift $S_2$ may be at or about 8.0 μm. A light shielding portion 304b of the first group of light shielding portions 306 has a shift $S_1$ relative to its corresponding data line 52b. A light shielding portion 304d of the second group of light shielding portions 308 has a shift $S_3$ relative to its respective data line 52d. The shift $S_2$ of middle light shielding portion 304c is larger than both the shift $S_1$ of light shielding portion 304b and the shift S3 of the light shielding portion 304d. Further, the shift $S_1$ of the middle light shielding portion 304b is larger than a shift between the central light shielding portion 304a and its corresponding data line 52a. The shift $S_3$ of the light shielding portion 304d is larger than a shift between the end light shielding portion 304e and its corresponding data line 52e. In an embodiment, one or both of the shift of the central light shielding portion 304a and the shift of the end light shielding portion 304e may be at or about zero (e.g., at or about no shift) as shown in FIG. 5.

The light shielding portions 304 between the central light shielding portion 304a and the middle light shielding portion 304c (which includes the first group of light shielding portions 306) are shown to have an equal pitch $P_5$. The light shielding portions 304 between the middle light shielding portion 304c and the end light shielding portion 304e (which includes the second group of light shielding portions 306) are shown to have an equal pitch $P_6$. However, it should be appreciated that one or both of the pitches $P_5$ and $P_6$ in an embodiment may not be constant. In an embodiment, moving from the central light shielding portion 304a to the middle light shielding portion 304c, the pitches $P_5$ of adjacent light shielding portions 306 may decrease continuously or periodically along the X direction. For example, the light shielding portion 304b may have a pitch that is smaller than the central light shielding portion 304a, and the middle light shielding portion 304c may have a pitch that is smaller than the light shielding portion 304b. In an embodiment, moving from the middle light shielding portion 304c to the end light shielding portion 304e, the pitches $P_6$ of adjacent light shielding portions may increase continuously or periodically along the X direction. For example, the light shielding portion 304d may have a pitch that is larger than the middle light shielding portion 304c, and the end light shielding portion 304e may have a pitch that is larger than the light shielding portion 304d.

In an embodiment, each of the color filters 25 (shown in FIG. 2) is positioned in the X direction between a pair of the light shielding portions 304. In an embodiment, the color filters 25 may be positioned relative to their corresponding pixel electrodes 14 in a similar manner to the light shielding portions 304 and the data lines 52. For example, color filters 25 may be shifted in the X direction to account for T/C shift that occurs when the substrates 20, 30 are bent. Each color filter 25 may have a center line that extends along a Y direction. A distance between middle light shielding portion 304c and the center line of a color filter 25 adjacent to the middle light shielding portion 304c, a distance between the light shielding portion 304b of the first group of light shielding portions 306 and the center line of a color filter 25 adjacent to the light shielding portion 304b, and a distance between the light shielding portion 304d of the second group of light shielding portions 308 and the center line of a color filter 25 adjacent to the light shielding portion 304d may be about the same in an embodiment so that the color filters 25 are shifted with their adjacent light shielding portion 304.

FIG. 5 illustrates light shielding portions 302, 304 for the curved display 1 that is curved along the X direction to be convex towards the viewer. In an embodiment, the curved display 1 may be curved to be concave towards the viewer. In such an embodiment, the pitch relationship would be the inverse of what is shown in FIG. 5. For example, the first pitch $P_5$ would be smaller than the second pitch $P_6$. In an embodiment, the curved display 1 may be curved in the Y direction instead of the X direction. In such an embodiment, the light shielding portions 302 extending the X direction may be configured (e.g., positioned relative to each other) to account for a T/C shift in the Y direction in a similar manner as described for the light shielding portions 304.

Figure 6:
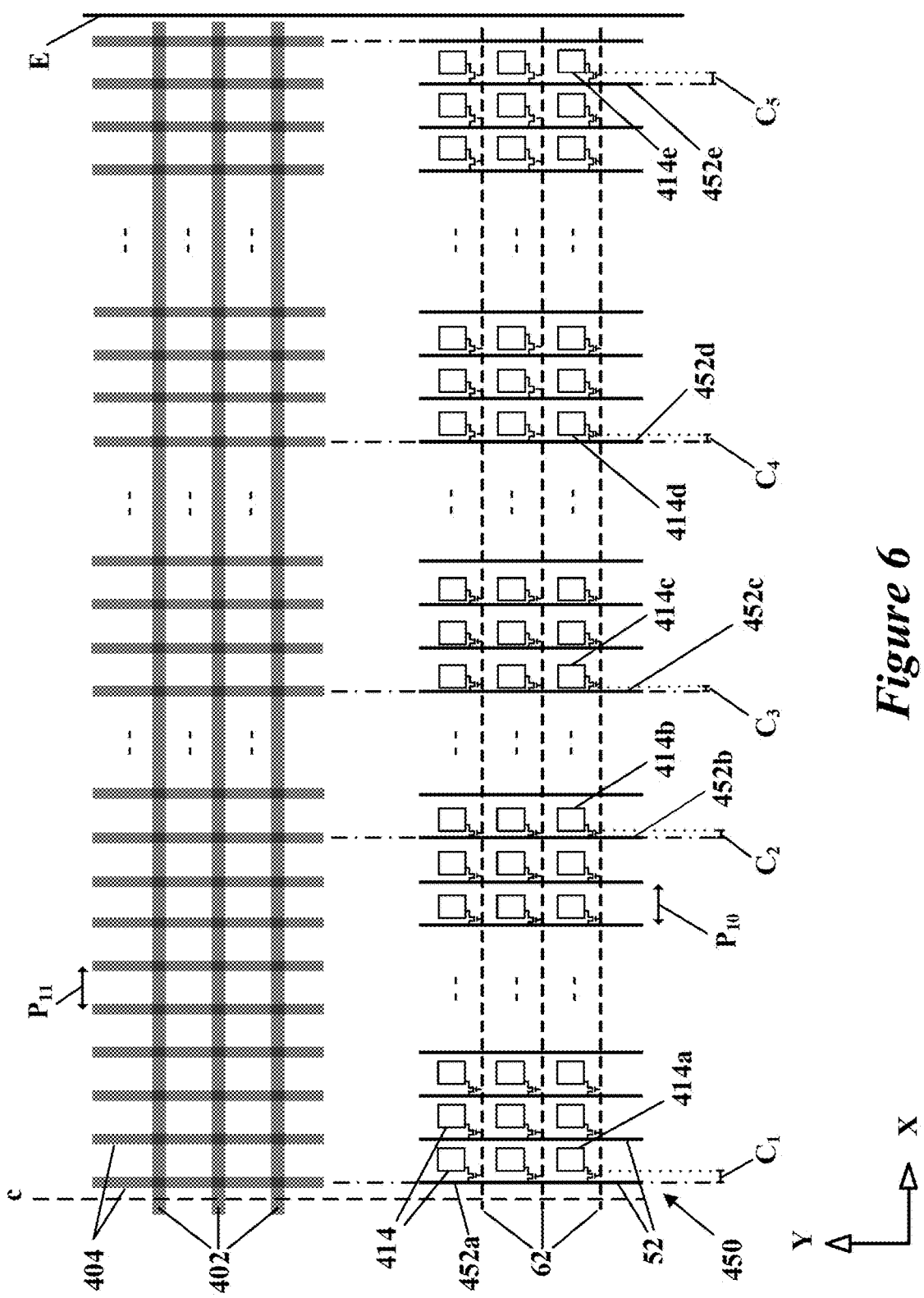
FIG. 6 is a schematic view of light shielding portions for a CF substrate and a corresponding portion of a TFT substrate in an embodiment.

FIG. 6 is a schematic view of light shielding portions 402, 404 in a portion of the CF substrate 20 and corresponding portion of a TFT substrate 450 in an embodiment. The light shielding portions 402 extend in the X direction and the light shielding portions 404 extend in the Y direction. The average pitch $P_{10}$ between the data lines 52 may be equal to the average pitch $P_{11}$ between the light shielding portions 404. In an embodiment, the pixel electrodes 414 are shifted along the direction of the bending (e.g. the X direction in FIG. 6). In an embodiment, the data lines 52 may be configured so that every adjacent pair of data lines 52 has an equal pitch $P_{10}$.

The pixel electrodes 414 include a central pixel electrode 414a, a middle pixel electrode 414c, an end pixel electrode 414e, a fourth pixel electrode 414b, and a fifth pixel electrode 414d. The end pixel electrode 414e is disposed at the edge E of the curved display 1. In an embodiment, the end pixel electrode 414e is disposed at the edge E of the curved display 1 and a distance between end pixel electrode 414e and the edge E is equal to or about 10% or less than length of the curved display 1 in the X direction. The central pixel electrode 414a is disposed closer to the center of the curved display 1 in the X direction than the end pixel electrode 414e. In an embodiment, the central pixel electrode 414a may be disposed along the center plane c or be the pixel electrode 414 closest to the center plane c of the curved display 1. The fourth pixel electrode 414b is disposed between the central pixel electrode 414a and the middle pixel electrode 414c in the X direction. The fifth pixel electrode 414d is disposed between the middle pixel electrode 414c and the end pixel electrode 414e.

Each pixel electrode 414 is electrically connected to a corresponding data line 52. Each pixel has a clearance that is the distance between the edge of a pixel electrode 414 and its respective data line 52 in the direction perpendicular to the data line (e.g., the X direction). The central pixel electrode 414a has a first clearance $C_1$ that is the distance between the central pixel electrode 414a and its corresponding data line 452a. The fourth pixel electrode 414b has a second clearance $C_2$ that is the distance between the fourth pixel electrode 414b and its corresponding data line 452b. The middle pixel electrode 414c has a third clearance $C_3$ that is the distance between the middle pixel electrode 414c and its corresponding data line 452c. The fifth pixel electrode 414d has a fourth clearance $C_4$ that is the distance between the fifth pixel electrode 414d and its corresponding data line 452d. The end pixel electrode 414e has a fifth clearance $C_5$ that is the distance between the end pixel electrode 414e and its corresponding data line 452e.

The pixel electrodes 414 in FIG. 6 are periodically shifted closer to their respective data line 52 to account for the T/C shift. The pixel electrodes 414 are shifted in the opposite direction of the T/C shift to offset the T/C shift. In an embodiment, the middle pixel electrode 414c may be the pixel electrode 414 disposed closest to a point where the maximum amount of T/C shift occurs (e.g., point PT1 or point PT2 in FIG. 3) in the X direction between the center c and the edge E. Accordingly, the middle pixel electrode 414c in an embodiment may be configured to have a clearance $C_3$ in the X direction that is the shortest or equal to the shortest among the pixel electrodes 414. The central pixel electrode 452a and end pixel electrode 414e in an embodiment may be positioned close enough to the center c and the edge E, respectively, of the curved display 1 such that they experience only a small amount of T/C shift. In such an embodiment, one or both of the central pixel electrode 452a and end pixel electrode 452e may be configured to have the largest or at least equal to the largest clearance $C_1$, $C_4$ of the pixel electrodes 414. The clearance $C_2$ for the fourth pixel electrode 414b is smaller than the clearance $C_1$ for the central pixel electrode 414a and is larger than the clearance $C_3$ for the middle pixel electrode 414c. The clearance $C_4$ for the fifth pixel electrode 414d is larger than the clearance $C_3$ for the middle pixel electrode 414c and is smaller than the clearance $C_5$ for the end pixel electrode 414e.

The clearances of the pixel electrodes 414 in the embodiment of FIG. 6 may changes (e.g., increase or decrease) periodically. The middle pixel electrode 414c in an embodiment may be shifted in the X direction by 8.0 μm and the clearances for the pixel electrodes 414 may be increased or decreased periodically by 1.0 μm. In such an embodiment, the pixel electrodes 414 would have 8 decreases and the pixel electrodes would be configured to have one of 9 clearances (including a shift of zero). For example, pixel electrodes 414 adjacent to the middle pixel electrode 414c in an embodiment may have the same clearance (e.g., clearance $C_3$) as the middle pixel electrode 414c. A group of 100 pixel electrodes 414 that are adjacent in X direction and include the middle pixel electrode 414c may have clearance $C_3$ in an embodiment. Each of the central pixel electrode 414a, the fourth pixel electrode 414b, the fifth pixel electrode 414 d, and the end pixel electrode 414e may have a group of adjacent pixel electrodes 414 that have the same clearance in a similar manner as described for the middle pixel electrode 414c. The clearances shown in FIG. 6 may be the configuration of pixel electrodes 414 and data lines 52 before or after the substrates 20, 450 are bent as the bending of the TFT substrate 450 would not significantly affect the clearances in an embodiment.

Alternatively, the clearances of all of the pixel electrodes 414 may be modified. For example, the pixel electrodes 414 located between the central pixel electrode 414a and the middle pixel electrodes 414c in the X direction may be modified to be have a first clearance and the pixel electrodes 414 located between the middle pixel electrode 414c and the end pixel electrode 414e may have a second clearance in an embodiment. In such an embodiment, the first clearance may be modified to be smaller relative to a non-modified clearance and the second clearance may be modified to be larger relative to a non-modified clearance.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A method for manufacturing a curved display comprising:
    attaching a first substrate to a second substrate in a stacked configuration, the first substrate comprising electrical lines and pixel electrodes, the pixel electrodes being arranged in a matrix in a first direction and a second direction, the electrical lines extending in the second direction, and the second substrate comprising light shielding portions extending in the second direction; and
    bending the first substrate and the second substrate to be curved along the first direction, wherein
    the light shielding portions include a first end light shielding portion disposed at an end of the curved display in the first direction, a central light shielding portion disposed closer to a center of the curved display in the first direction than the first end light shielding portion, and a middle light shielding portion disposed between the central light shielding portion and the first end light shielding portion in the first direction,
    a first group of the light shielding portions are disposed between the central light shielding portion and the middle light shielding portion, a second group of the light shielding portions are disposed between the central light shielding portion and the first end light shielding portion, and
    before the bending of the first substrate and the second substrate, an average pitch of the shielding portions of the first group is different from an average pitch of the light shielding light shielding portions of the second group.

2. The method for manufacturing the curved display according to claim 1, wherein
    the second substrate is closer to a display side of the curved display than the first substrate,
    the curved display is curved convexly towards the display side of the curved display along the first direction, and
    before the bending of the first substrate and the second substrate, an average pitch in the first direction of light shielding portions of the first group is longer than an average pitch of the light shielding portions of the second group.

3. The method for manufacturing the curved display according to claim 2, wherein
    before the bending of the first substrate and the second substrate, a pitch in the first direction of a first adjacent pair of the light shielding portions of the first group is longer than a pitch in the first direction of a second adjacent pair of the light shielding portions of the first group.

4. The method for manufacturing the curved display according to claim 2, wherein
    before the bending of the first substrate and the second substrate, pitches of each adjacent pair of the light shielding portions of the first group are equal.

5. The method for manufacturing the curved display according to claim 1, wherein
    the second substrate is closer to a display side of the curved display than the first substrate,
    the curved display is curved concavely towards the display side of the curved display along the first direction, and
    before the bending of the first substrate and the second substrate, an average pitch of the light shielding portions of the first group in the first direction is shorter than an average pitch of light shielding portions of the second group in the first direction.

6. The method for manufacturing the curved display according to claim 1, wherein
    the second substrate further includes color filters, the color filters being arranged in a line in the first direction, each of the color filters being positioned between a pair of the light shielding portions, and
    before the bending of the first substrate and the second substrate, one or more color filters are shifted in the first direction relative to a corresponding one of the pixel electrodes.

* * * * *